Oct. 30, 1962

G. E. THERIAULT 3,061,786

SIGNAL TRANSLATING CIRCUIT

Filed Jan. 27, 1960

INVENTOR.
Gerald E. Theriault
BY Eugene M. Whitacre
Attorney

3,061,786
SIGNAL TRANSLATING CIRCUIT

Gerald E. Theriault, Haddon Heights, N.J., assignor to Radio Corporation of America, a corporation of Delaware Filed Jan. 27, 1960, Ser. No. 4,965
4 Claims. (Cl. 325—427)

This invention relates to signal translating circuits, and more particularly relates to signal selection circuits for radio signal receivers or the like.

It is known that the selectivity of a tuned circuit is a function of the circuit "Q" or Figure of Merit. In other words the lower the circuit "Q", the wider the bandwidth and the lower the selectivity. Although a tuned circuit may be designed with a relatively high initial or unloaded "Q", and good selectivity, the connection of a utilization circuit produces a loading effect which may materially reduce the unloaded "Q", thereby reducing the selectivity. The amount of loading of a tuned circuit that can be tolerated is a compromise between: (1) the selectivity desired; (2) the efficiency of power transfer between the tuned circuit and the load; and (3) the amplitude of voltage required from the tuned circuit. For maximum "Q" and selectivity, the loading of the tuned circuit by the utilization circuit is as low as possible resulting in inefficient power transfer and a small amplitude output voltage. For optimum power transfer, the loading of the tuned circuit by the utilization circuit is increased until the load resistance equals the source resistance of the tuned circuit, thus decreasing the unloaded "Q" of the tuned circuit by a factor of two, but increasing the amplitude of the output voltage. To obtain a still greater amplitude of output voltage, the loading on the tuned circuit may be increased still further at a sacrifice in both selectivity and efficiency of power transfer.

Because of the aforementioned loading effect on the tuned circuits, a relatively large number of tuned circuits are required in radio signal receivers to achieve good selectivity. For example in tuned radio frequency (TRF) receivers, a plurality of tunable radio frequency amplifier stages which provide the necessary selectivity are used ahead of the audio detector stage. Such receivers present stability problems because of the large gain achieved at the signal frequency, as well as difficulties with the tracking of the tunable circuits, particularly at higher frequencies. A large number of tuned circuits are also required to achieve good selectivity in superheterodyne signal receivers. As is well known, supereheterodyne receivers include two or more tunable circuits for signal selection and oscillator functions as well as a plurality of fixed tuned circuits in the receiver intermediate frequency amplifier channel.

It is an object of this invention to provide improved signal selection circuits for radio signal receivers.

Another object of this invention is to provide an improved signal receiving system requiring fewer tuning circuits than herebefore required to achieve comparable selectivity.

A further object of this invention is to provide an improved TRF receiver, wherein sufficient selectivity is provided by a simple tunable signal selection stage, that high frequency amplification can be effected by suitable wide band amplifiers.

A still further object of this invention is to provide an improved highly selective tuning circuit which achieves and maintains a high Q or Figure of Merit, notwithstanding heavy loading by a utilization circuit.

In accordance with the invention, a resonant circuit including an inductor and a capacitor tuned to a desired signal frequency is coupled to a suitable utilization circuit such as an amplifier stage. A negative resistance device, such as a tunnel diode, which is biased to exhibit a stable negative resistance, is also coupled to the resonant circuit. The negative resistance device is loaded sufficiently so that oscillation does not occur. The effect of the negative resistance device is to reflect a negative resistance into the resonant circuit, which operates to reduce the loading effect of any positive resistances thereby raising or multiplying the resonant circuit Figure of Merit or "Q". The loaded "Q" of a resonant circuit may be made as great or greater than the unloaded "Q" thereby materially improving the selectivity of the resonant circuit.

In accordance with an embodiment of the invention, the inductor of the resonant circuit comprises the loop antenna of a signal receiver. The enhanced selectivity of the antenna circuits permits the use of fewer tuned circuits or the same number of less expensive lower "Q" tuned circuits in the receiver for comparable selectivity.

In accordance with another embodiment of the invention, the loading on the antenna circuit is increased with increasing signal strength. The increased loading results in a lower antenna circuit "Q" and operates to reduce the gain of the antenna circuit for stronger signals. The decreased antenna circuit "Q" increases the receiver bandwidth which is compatible with more faithful reproduction of signals that are of sufficient amplitude to mask disturbances resulting from wider band operation.

The novel features which are considered to be characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
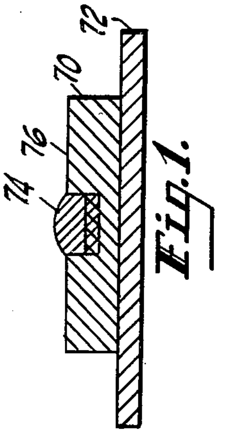
FIGURE 1 is a sectional view of a typical negative resistance diode which may be used in circuits embodying the invention.

Reference is now made to FIGURE 1 which is a diagrammatic sectional view of a typical negative resistance diode that may be used in the arrangement of the invention. By way of example, Leo Esaki, Physical Review, Vol. 109, page 603, 1958, has reported a thin or abrupt junction diode exhibiting a negative resistance over a region of low forward bias voltages, i.e., less than 0.3 volt. The diode was prepared with a semiconductor having a free charge carrier concentration several orders of magnitude higher than that used in conventional diodes.

A diode which was constructed and could be used in practicing the invention includes a single crystal bar of n-type germanium which is doped with arsenic to have a donor concentration of $4.0 \times 10^{19}$ cm.$^{-3}$ by methods known in the semiconductor art. This may be accomplished, for example, by pulling a crystal from molten germanium containing the requisite concentration of arsenic. A wafer 70 is cut from the bar along the 111 plane, i.e. a plane perpendicular to the 111 crystallographic axis of the crystal. The wafer 70 is etched to a thickness of about 2 mils with a conventional etch solution. A major surface of this wafer 70 is soldered to a strip 72 of a conductor, such as nickel, with a conventional lead-tin-arsenic solder, to provide a non-rectifying contact between the wafer 70 and the strip 72. The nickel strip 72 serves eventually as the base lead. A 5 mil diameter dot 74 of 99 percent by weight indium, 0.5 percent by weight zinc and 0.5 weight percent gallium is placed with a small amount of a commercial flux on the free surface 76 of the germanium wafer 70 and then heated to a temperature in the neighborhood of 450° C. for one minute in an atmosphere of dry hydrogen to alloy a portion of the dot to the free surface 76 of the wafer 70, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. The etching step cleans up the surface of the wafer around the dot to reduce leakage current between the wafer and the dot. A suitable slow iodide etch is prepared by mixing one drop of a solution comprising 0.55 gram potassium iodide, and 100 $cm.^3$ water in 10 $cm.^3$ concentrated acetic acid, and 100 $cm.^3$ concentrated hydrofluoric acid. A pigtail connection may be soldered to the dot where the device is to be used at ordinary frequencies. Where the device is to be used at high frequencies, contact may be made to the dot with a low impedance lead.

Other semiconductors may be used instead of germanium, particularly silicon and the III—V compounds. A III—V compound is a compound composed of an element from group III and group V of the periodic table of chemical elements, such as gallium arsenide, indium arsenide and indium antimonide. Where III—V compounds are used, the p and n type impurities ordinarily used in those compounds are also used to form the diode described. Thus, sulfur is a suitable n-type impurity and zinc a suitable p-type impurity which is also suitable for alloying.

Figure 2:
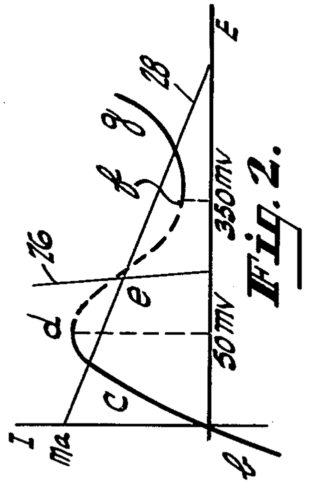
FIGURE 2 is a graph illustrating the voltage-current characteristic of a negative resistance diode of the type shown in FIGURE 1.

The current-voltage characteristic of a typical diode suitable for use with circuits embodying the invention is shown in FIGURE 2. The current scales depend on area and doping of the junction, but representative currents are in the milliampere range.

For a small voltage in the back direction, the back current of the diode increases as a function of voltage as is indicated by the region *b* of FIGURE 2.

For small forward bias voltages, the forward current increases as a function of voltage (FIGURE 2, region *c*). At higher forward bias voltages, the forward current due to tunneling reaches a maximum (region *d*, FIGURE 2), and then begins to decrease. This drop continues (FIGURE 2, region *e*) until a current minimum is reached (region *f*, FIGURE 2) and injection over the barrier becomes important and the characteristic turns into the usual forward behavior (region *g*, FIGURE 2).

The negative resistance of the diode is the incremental change in voltage divided by the incremental change in current, or the reciprocal slope of the region *e* of FIGURE 2. To bias the diode for stable operation in the negative resistance region of its characteristic requires a suitable voltage source having a smaller internal impedance than the negative resistance of the diode. Such a voltage source has a D.C. load line 26 as indicated in FIGURE 2, which is characterized by a current-voltage relationship which has a greater slope than the negative slope of the diode characteristic and intersects the diode characteristic at only a single point. If the voltage source has an internal resistance which is greater than the negative resistance of the diode, the source would have a load line 28 with a smaller slope than the negative slope of the diode characteristic as indicated in FIGURE 2, and would intersect the diode characteristic curve at three points. Under the latter conditions the diode is not stably biased in the negative resistance region. This is because an incremental change in current through the diode due to transient or noise currents or the like produces a regenerative reaction which causes the diode to assume one of its two stable states represented by the intersection of the load line 28 with the positive resistance portions of the diode characteristic curve.

Figure 3:
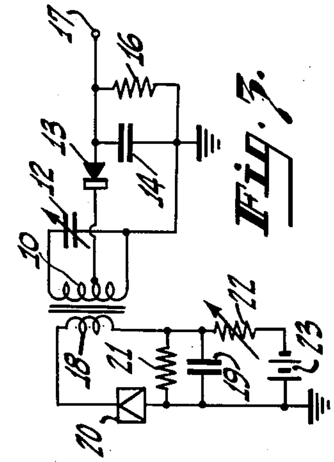
FIGURE 3 is a schematic circuit diagram of a portion of a crystal radio signal receiver embodying the invention.

The crystal receiver shown in FIGURE 3 includes a loop antenna winding on a core of ferrite material. The winding 10 tuned to the frequency of a desired signal modulated radio wave by a variable tuning capacitor 12. Signal modulated radio frequency waves intercepted by the loop antenna are demodulated in a detector circuit including a rectifier 13, which may comprise a crystal rectifier or a junction rectifier having one electrode thereof connected to a tap on the loop antenna winding 10. The other electrode of the rectifier 13 is connected to ground through a signal bypass capacitor 14 and a resistor 16. The direct current (D.C.) path for the rectifier 13 is completed through a portion of the antenna winding 10, one terminal of which is grounded.

If desired, the resistor 16 may comprise the resistance of a utilization device such as earphones. Alternatively, further audio amplification stages, not shown, may be connected to amplify audio frequency signals which are developed across the resistor 16 and are available at the output terminal 17.

The equivalent resistance of the detector circuit including rectifier 13 between the tap on the winding 10 and ground constitutes a load on the antenna circuit including the loop antenna winding 10 and the variable capacitor 12. This load effectively reduces the unloaded "Q" of the antenna circuit thereby decreasing the selectivity thereof. To illustrate, the unloaded "Q" of ferrite loop antenna circuits commonly used in home broadcast receivers is on the order of 250. For maximum power transfer, the effective resistance of the loading on the antenna circuit is made approximately equal to the radiation resistance of the antenna winding. Thus the loaded "Q" of the antenna circuit is reduced to about 125. The antenna or tuning circuit losses of simple crystal receivers reduces the sensitivity and selectivity to the point that such receivers are restricted to the reception of strong signals from local stations.

In accordance with the invention, a Q multiplying circuit is coupled with the antenna circuit. The Q multiplying circuit includes a winding 18 which is coupled to the antenna winding 10 and may, if desired, be wound on the core of the loop antenna winding. One end of winding 18 is connected to ground for radio frequencies through the bypass capacitor 19. The other end of the winding 18 is connected to ground through a negative resistance device 20, which may for example comprise a tunnel diode.

The tunnel diode includes a biasing circuit comprising a pair of resistors 21 and 22 connected in series across a battery 23. The resistor 21 is selected to have a resistance value which is less than the absolute value of the minimum negative resistance of a tunnel diode 20, and is proportioned with respect to the resistor 22, to develop a bias voltage thereacross to bias the tunnel diode 20 in the negative resistance region of its operating characteristic.

Figure 4:
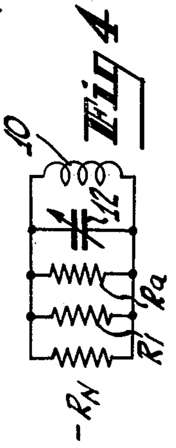
FIGURE 4 is an equivalent circuit diagram of the portion of the crystal radio signal receiver shown in FIGURE 3.

The crystal receiver described may be viewed as the equivalent circuit shown in FIGURE 4. The tunnel diode 20 which has a negative resistance $R_n$ is effectively connected in parallel with the antenna circuit including the winding 10 and tuning capacitor 12, and two loading resistances: the radiation resistance $R_a$ of the winding 10; and the effective resistance $R_l$ of the detector circuit. The radiation resistance $R_a$ is a function of the loop antenna winding design and the coefficient of coupling between the windings 10 and 18. The magnitude of the resistance $R_l$ is a function of the detector circuit resistance, the location of the tap on the winding 10, and the coefficient of coupling between the windings 10 and 18.

The total negative resistance of $R_n$ is selected to be slightly greater than the combined positive resistance contributed by $R_a$ and $R_l$ so that a resultant positive resistance is maintained to prevent oscillation. Due to the action of the negative resistance device, a power gain can be achieved in the transfer of signal energy from the antenna circuit to the detector.

The effect of the negative resistance $R_n$ is to increase the apparent positive resistance across the antenna circuit to a value greater than that produced by the combination of the resistances $R_l$ and $R_a$ taken alone. By selection of the resistances $R_a$, $R_l$ and $R_n$ to present a high resultant positive resistance, the loaded "Q" of the antenna circuit is set at a desired high value which may, for example, be higher than the unloaded "Q." The higher circuit "Q" improves the selectivity of the receiver.

The circuit of FIGURE 3 provides an automatic gain and bandwith control due to the variable loading effect of the rectifier 13. The rectifier 13 exhibits a lower resistance for stronger signals than for weaker signals. Thus as signal strength increases, the loading on the antenna circuit is increased resulting in a reduction in the "Q" and gain of the antenna circuit. The reduced circuit "Q," or selectivity, is accompanied by an increase in the bandwith. This is compatible with greater fidelity of operation since the stronger signal masks those additional disturbances that may be introduced by the wider band operation of the receiver.

Figure 5:
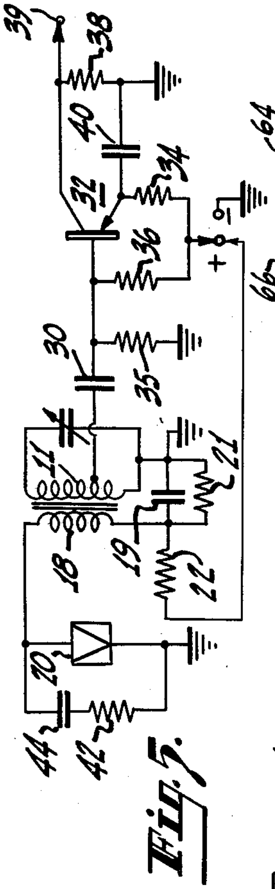
FIGURE 5 is a schematic circuit diagram of a portion of a TRF receiver embodying the invention.

The schematic circuit diagram of FIGURE 5 is similar to that shown in FIGURE 3 with the exception that the antenna is shown as driving a wideband amplifier stage including a transistor 32. As is shown in FIGURE 3 the tunable antenna circuit is coupled by way of a capacitor 30 to the base electrode of the transistor 32. The emitter of the transistor 32 is connected through an emitter biasing resistor 34 to the positive terminal of a source of biasing potential, the negative terminal of which is grounded. Suitable biasing voltage is provided for the base electrode of the transistor 32 at the junction of a pair of serially connected resistors 35 and 36 which are connected between the positive terminal and ground, of the biasing potential supply. Radio frequency wave energy amplified by the transistor circuit is developed across a load resistor 38 which is connected between the collector electrode transistor 32 to ground. The amplified radio frequency wave energy may be applied to suitable utilization means, such as additional wideband radio frequency amplifier stages connected to the terminal 39.

The biasing circuit of the tunnel diode 20 is substantially the same as that shown in FIGURE 1 with the exception that a common direct voltage supply is used to bias the diode 20 and the transistor 32. If desired, a separate voltage supply could be provided for the tunnel diode. Another difference in the biasing circuit is that the anode of the diode is grounded in the circuit of FIGURE 3, whereas the cathode of the diode is grounded in the circuit of FIGURE 5.

In tunnel diode circuits care must be taken to prevent spurious oscillation. For example even the adequate loading provided across the winding 18, the negative resistance of the diode may resonate with the inductance of the connections between the tunnel diode 20 and the winding 18. Spurious oscillation may be prevented by careful mechanical design which maintains short connecting leads to the tunnel diode. An additional precaution may be taken by providing a resistor 42 and a capacitor 44 in series across the tunnel diode 20. The reactance of the capacitor 44 is made larger with respect to the resistance of the resistor 42 at the signal frequency. At the signal frequency the loading effect of the resistor 42 capacitor 44 combination is negligible. At higher frequencies, where spurious oscillations most readily occur, the capacitive reactance of the capacitor is lower, and the tunnel diode is loaded sufficiently by the series combination to prevent oscillation.

In the circuit of FIGURE 5 the signal selection circuit including the loop antenna tuned by the variable capacitor has nearly a constant unloaded Q across the broadcast frequency range. This means that the radiation resistance of the antenna circuit increases with frequency, and, therefore, the loading on the tunnel diode decreases as frequency increases. To maintain the loading on the tunnel diode circuit substantially constant so that the circuit does not break into oscillation, the transistor circuit is adjusted to provide a loading resistance change in such a direction as to counteract the change of loading on the antenna circuit as the antenna circuit is tuned over the frequency range.

The input resistance of a transistor amplifier drops with an increase in frequency. This effect can be controlled by selecting the value of a bypass capacitor 40 connected between the emitter of the transistor 32 and ground. Thus the input resistance of the transistor 32 can be adjusted to vary with frequency in a manner to maintain the total loading on a tunnel diode constant, or substantially constant over the tuning range of the antenna circuit.

Figure 6:
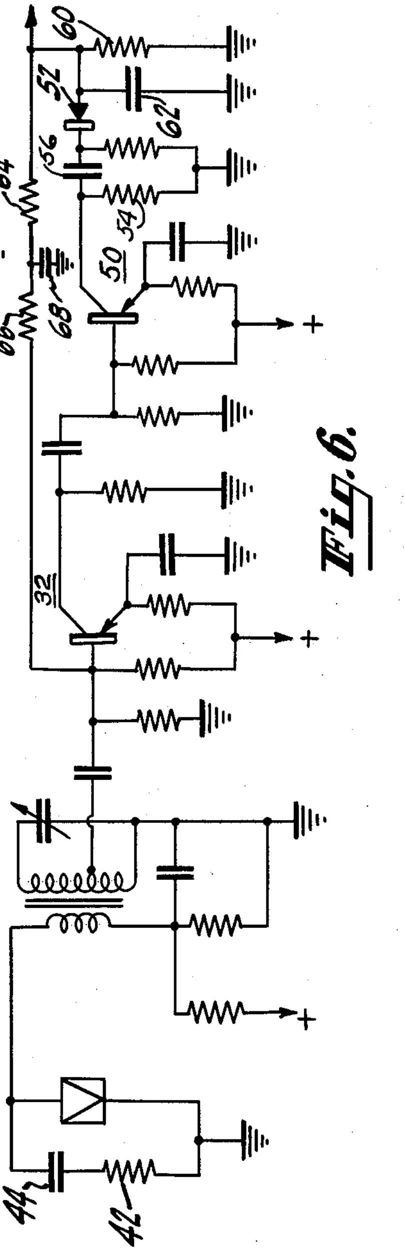
FIGURE 6 is a schematic circuit diagram of a portion of a TRF radio signal receiver illustrating a modification of the invention shown in FIGURE 5.

The schematic circuit diagram shown in FIGURE 6 is similar to that shown in FIGURE 5 but includes in addition, additional wideband transistor amplifier 50 which is coupled to and driven by the wideband amplifier circuit including the transistor 32. The wideband amplifier 50 drives the receiver audio frequency detector stage including a rectifier 52. Radio frequency wave energy is amplified by the wideband amplifier 50 and developed across its output load resistor 54 and is coupled by a capacitor 56 to the rectifier 52. The modulation components of the rectified radio frequency wave energy is developed across an output load resistor 60, and the R.F. component is bypassed to ground through a capacitor 62. The direct current component of the rectified radio frequency carrier wave developed across the receiver 60 is filtered by the resistor-capacitor network including the resistors 64 and 66 and the capacitor 68, and is coupled to the base electrode of the transistor 32 as an AGC voltage.

In operation, as the signal level of the received radio frequency carrier wave increases, a larger radio frequency carrier wave is impressed on the rectifier 52, and a more negative AGC voltage is applied to the base of the transistor 32. This voltage is in a direction to increase the current through the transistor 32, and decreases the input resistance between base and emitter electrodes of the transistor 32. The decreased resistance is effectively connected across the antenna circuit, thereby also being reflected across the tunnel diode circuit. In other words a smaller positive resistance is effectively then inserted in the antenna circuit reducing the antenna circuit Q or selectivity. This effect increases the bandwidth of the antenna circuit for stronger signals, providing a lower gain for the stronger signals and hence tends to maintain the signal level developed across the audio frequency detector load resistor 60 at a constant level. For very strong signals, the signal level is decreased due to collector current saturation of the transistor 32.

With circuits in accordance with the invention, the problem of design compromise between selectivity, efficiency of power transfer, and output amplitude of voltage from tuned circuits is materially reduced. Optimum power transfer can be effected at a higher loaded "Q" or selectivity of the tuned circuit than is available when the circuit is unloaded. The power gain provided by the "Q" multiplying circuit of the invention may also be readily adapted to permit the construction of simplified signal receivers having a fewer number of tuned circuits to achieve comparable selectivity.

What is claimed is:

1. In a signal receiving system an antenna circuit including a loop antenna and a variable capacitor connected in parallel with said loop antenna for tuning said antenna circuit to the frequency of a signal to be received, the positive resistance of said antenna circuit effectively increasing as said variable capacitor tunes said loop antenna to higher frequencies, an amplifier circuit including a transistor having base, emitter and collector electrodes, means for coupling said antenna circuit between said base and emitter electrodes, an output circuit coupled to said collector electrode, a voltage controlled negative resistance diode, bias circuit means connected to said diode for biasing said diode to exhibit a negative resistance, means coupling said diode to said loop antenna, the effect of positive resistance appearing in parallel with said diode from said antenna circuit and said amplifier circuit being smaller than the negative resistance exhibited by said diode to increase the effective positive resistance across said antenna circuit to increase the Q thereof, and means for compensating for the variation in loading on said diode due to the change in effective positive resistance of said antenna circuit as said antenna circuit is tuned over a range of frequencies comprising the parallel combination of a resistor and capacitor connected in series between said emitter electrode and said antenna circuit.

2. In a signal receiving system, an antenna circuit including a loop antenna and a capacitor connected in parallel with said loop antenna for tuning said loop antenna to the frequency of a signal to be received, an amplifier circuit including a transistor having base, emitter and collector electrodes, means for coupling said antenna circuit between said base and emitter electrodes, a detector circuit coupled to said collector electrode for deriving a direct voltage the amplitude of which is a function of the strength of a received signal, means for applying said direct voltage between said base and emitter electrodes so that an increase in the received signal strength increases the forward bias between said base and emitter electrodes thereby decreasing the positive resistance between said base and emitter electrodes, a voltage controlled negative resistance diode, bias circuit means connected to said diode for biasing said diode to exhibit a negative resistance, and means coupling said diode to said loop antenna, the effective positive resistance appearing in parallel with said diode from said antenna circuit and said amplifier circuit being smaller than the negative resistance exhibited by said diode thereby effectively increasing the positive resistance across said antenna circuit to increase the Q thereof, said decreasing resistance between said base and emitter electrodes in response to increasing strength of said received signal operative to reduce the resultant positive resistance across said antenna circuit and the Q thereof whereby the strength of signals applied to said amplifier circuit is maintained substantially constant.

3. A signal receiving system comprising in combination, an antenna circuit including an inductor and a variable capacitor for tuning said antenna circuit to the frequencies of signals to be received, a transistor amplifier coupled in parallel with said antenna circuit to amplify said received signals, said transistor amplifier having an input impedance which tends to increase the loading on said antenna circuit, a voltage controlled negative resistance diode coupled in parallel with said antenna circuit and adapted to be biased to exhibit a predetermined negative resistance of a magnitude which reduces the loading on said antenna circuit to increase the effective Q of said antenna winding, first circuit means coupled to said transistor amplifier for changing the input impedance thereof as a function of the frequency to which said antenna circuit is tuned and second circuit means coupled to said transistor amplifier for changing the input impedance thereof as a function of received signal strength.

4. In a signal receiving system the combination comprising, an antenna circuit including a loop antenna and a variable capacitor connected in parallel with said loop antenna for tuning said antenna circuit to the frequency of a signal to be received, the effective positive resistance across said antenna circuit increasing as said variable capacitor tunes said antenna circuit to higher frequencies, a transistor amplifier having an input circuit coupled to said antenna circuit and an output circuit, said input circuit having an input impedance which effectively appears across at least a portion of said antenna circuit, a voltage controlled negative resistance diode coupled to said loop antenna, bias circuit means connected to said diode for biasing said diode to exhibit a predetermined negative resistance the absolute value of which is of a value with respect to the effective positive resistances of said antenna and input circuits to effectively decrease the effective resistance and impedance across said antenna circuit to increase the Q thereof, first circuit means coupled to the input circuit of said transistor amplifier for compensating for the variation in loading on said negative resistance diode due to the change in effective positive resistance of said antenna circuit as said antenna circuit is tuned over a range of frequencies, a detector circuit coupled to the output circuit of said transistor amplifier for deriving a direct voltage the amplitude of which is a function of the strength of a received signal, and second circuit means for applying said direct voltage to the input circuit of said transistor amplifier such that an increase in received signal strength reduces the input impedance of said input circuit to reduce the Q of said antenna circuit and thereby provide automatic gain control for said signal receiving system.

References Cited in the file of this patent

UNITED STATES PATENTS 2,923,816 Schultz ---------------- Feb. 2, 1960

FOREIGN PATENTS 236,648 Great Britain ------------ July 9, 1925